United States Patent [19]

Stanley

[11] Patent Number: 4,867,532
[45] Date of Patent: Sep. 19, 1989

[54] WAVELENGTH SELECTION DEVICE HAVING A DIFFRACTION GRATING MOUNTED ON A TORSION MEMBER

[75] Inventor: Ian W. Stanley, Ipswich, United Kingdom

[73] Assignee: British Telecommunications Public Limited Company, United Kingdom

[21] Appl. No.: 80,464
[22] PCT Filed: Oct. 16, 1986
[86] PCT No.: PCT/GB86/00629
§ 371 Date: Jun. 12, 1987
§ 102(e) Date: Jun. 12, 1987
[87] PCT Pub. No.: WO87/02476
PCT Pub. Date: Apr. 23, 1987

[30] Foreign Application Priority Data

| Oct. 16, 1985 | [GB] | United Kingdom | 8525458 |
| Oct. 16, 1985 | [GB] | United Kingdom | 8525459 |
| Oct. 16, 1985 | [GB] | United Kingdom | 8525460 |
| Oct. 16, 1985 | [GB] | United Kingdom | 8525461 |
| Oct. 16, 1985 | [GB] | United Kingdom | 8525462 |
| Oct. 23, 1985 | [GB] | United Kingdom | 8526189 |

[51] Int. Cl.⁴ .................. G01J 3/18; G02B 27/44
[52] U.S. Cl. .................. 350/162.23; 356/334
[58] Field of Search ............ 356/334, 328, 305; 350/162.19, 162.23; 372/20, 102

[56] References Cited

U.S. PATENT DOCUMENTS

| 1,438,974 | 12/1922 | Wente | 350/487 X |
| 2,586,531 | 10/1958 | Brouwer | 356/334 X |
| 2,920,529 | 1/1960 | Blythe | 350/487 |
| 3,443,243 | 5/1969 | Patel | 350/162.23 X |
| 4,115,747 | 9/1978 | Sato et al. | 350/355 X |
| 4,450,563 | 5/1984 | Bepko | 372/23 |

FOREIGN PATENT DOCUMENTS

0040302 11/1981 European Pat. Off. .
2127987 A 4/1984 United Kingdom .

OTHER PUBLICATIONS

Patents Abstracts of Japan, vol. 9, No. 257 (P-396) (1980), 15th Oct. 1985, & JP, A, 60107532 (Toshiba K. K.) 13 Jun. 1985.
Patent Abstract of Japan, vol. 6, No. 2, (P-96), Jan. 8, 1982, 56-126818.
"Silicon Torsional Scanning Mirror", by Kurt E. Petersen-32 IBM Jnal of Research & Development vol. 24, (1980), Sep. No. 5, Armonk, New York, USA-pp. 631-637.

*Primary Examiner*—Bruce Y. Arnold
*Assistant Examiner*—David J. Edmondson
*Attorney, Agent, or Firm*—Nixon & Vanderhye

[57] ABSTRACT

The wavelength selection device comprises a substrate (1); and a deflectable wavelength selection member constituted by a diffraction grating (10) provided by a torsion member (6) mounted to the substrate (1). A pair of electrode (4,5) are responsive to a control current to cause the torsion member (6) to deflect whereby radiation centered on a predetermined wavelength is selected from radiation having a number of wavelengths impinging on the selection member (10) by setting the selection member (10) at a predetermined angle to the incoming radiation.

11 Claims, 1 Drawing Sheet

WAVELENGTH SELECTION DEVICE HAVING A DIFFRACTION GRATING MOUNTED ON A TORSION MEMBER

This application is related to my copending commonly assigned application Nos. 80,465 and 80,469 filed currently herewith.

The invention relates to a wavelength selection device and a method of selecting radiation centred on a particular wavelength.

It is important when using recently developed laser chips to be able to improve their performance by narrowing the range of wavelengths emitted by the chip. This has been done in the past by positioning a diffraction grating coaxial with the beam emitted by the laser chip and at such an angle to the impinging beam that a selected wavelength is reflected back along the axis towards the laser chip. This angle is the Bragg angle. It has proved quite difficult to do this in the past due to the cumbersome nature of the mounting arrangements which are required to support the diffraction grating particularly when compared with the small dimensions of laser chips.

In accordance with one aspect of the present provided by a torsion member mounted to the substrate; and control means responsive to control signals to cause the selection member to deflect, whereby radiation centred on a predetermined wavelength is selected from radiation having a number of wavelengths impinging on the selection member by setting the selection member at a predetermined angle to the incoming radiation.

The invention enables a deflectable wavelength selection member to be constructed on a much smaller scale than hitherto by using a microengineering technique thus reducing the problems previously encountered with conventional diffraction gratings.

In accordance with a second aspect of the present invention, a method of selecting radiation centred on a particular wavelength from an original beam of radiation comprising a number of different wavelengths comprises causing the original beam to impinge on a wavelength selection device according to the one aspect of the invention; and causing the wavelength selection member to deflect whereby only radiation having a wavelength centred on the selected wavelength is deflected through a predetermined angle.

Preferably, the wavelength selection member comprises a diffraction grating although other types of selection members could also be used. In the case of a diffraction grating, the surface of the torsion member may be ruled to define the grating.

Conveniently, the diffraction grating comprises a reflection grating although in some circumstances a transmission grating could also be used providing one or more apertures were provided in the substrate to enable transmitted radiation to pass through.

Preferably, the torsion member comprises a torsion plate which is conveniently integrally formed with the substrate. This latter arrangment can be achieved using conventional masking and etching techniques or laser etching techniques particularly where the material from which the substrate is formed is a single crystal of for example silicon when anisotropic etching techniques can be used. The integral arrangement is particularly useful since it reduces the number of separate parts involved and thus improves the integrity of the device.

In some examples, the device may further comprise a selective wavelength transmission member mounted adjacent the wavelength selection member and movable therewith, the selective wavelength transmission member permitting only certain wavelengths of impinging radiation to be transmitted therethrough.

With this arrangement, a two stage wavelength selection operation is carried out. The wavelength selection member (typically a diffraction grating) provides a coarse wavelength tuning element while the additional selective wavelength transmission member provides a fine tuning element.

Although the two members could be mounted separately on the substrate, preferably the members are connected together by one or more spacers.

Conveniently, the selective wavelength transmission member is positioned such that radiation is incident thereon prior to being incident on the wavelength selection member although an opposite arrangement is also feasible.

Three examples of devices and methods in accordance with the invention will now be described with reference to the accompanying drawings, in which.

Figure 1:
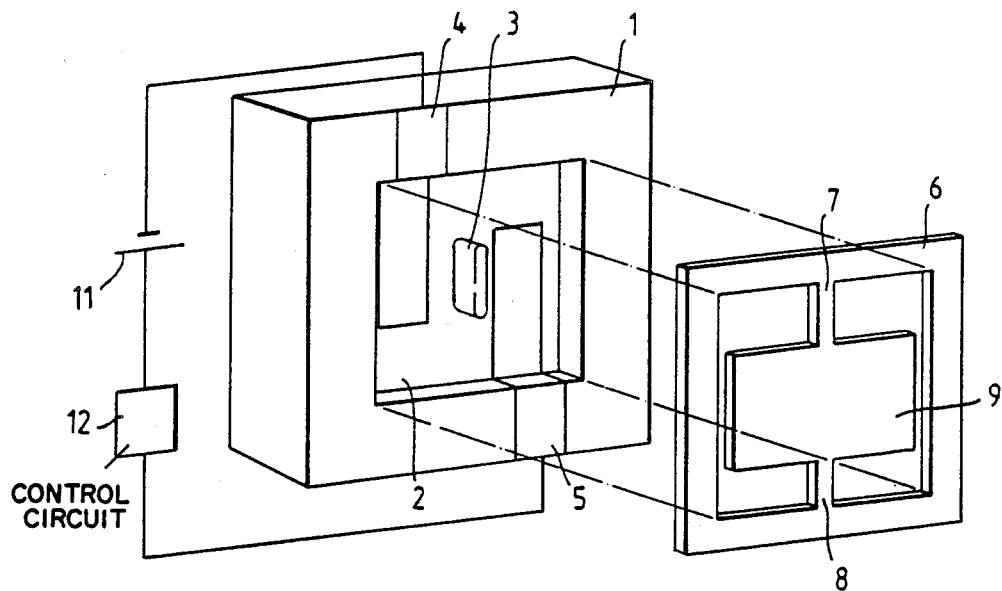
FIG. 1 is an exploded plan view of one example.

The example shown in FIG. 1 comprises a single crystal silicon substrate 1 having a square recess 2 in which a central upstanding ridge 3 integrally formed with the base is provided. On either side of the ridge 3 are mounted respective electrode plates 4, 5. A torsion plate 6 is integrally formed with the support ridge 3 and has a pair of torsion bars 7, 8 and a central square portion 9 carrying a diffraction grating 10 (FIG. 2).

Figure 2:
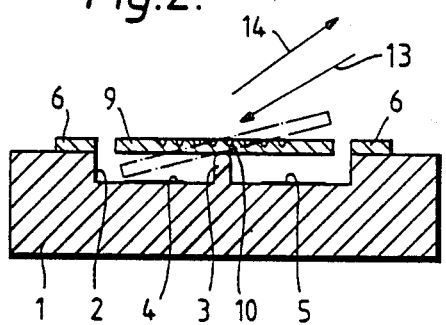
FIG. 2 is a side elevation of the first example shown in FIG. 1.

The arrangement shown in FIGS. 1 and 2 may be formed using a conventional masking and etching technique and a diffraction grating, which is a reflection grating, can be formed by ruling the surface of the portion 9 before or after the etching process.

As can be seen in dashed lines in FIG. 2, the torsion plate 6 can be deflected through an angle about the ridge 3 and this is achieved by generating an electrostatic field between the electrodes 4, 5. The electrodes 4, 5 are connected to a power source 11 and a control element 12 for varying the current applied to the electrodes.

In use, a beam of radiation, typically optical radiation, is incident on the diffraction grating 10 in a direction indicated by the arrow 13. The torsion plate 6 is deflected through a selected angle. Radiation centred on any particular wavelength will be reflected through the Bragg angle which is unique to each wavelength. In the FIG. 2 example it is arranged that radiation centred on a desired wavelength is reflected in the direction of the arrow 14.

In a typical case, the depth of the recess 2 may be about 12.5 microns with the diffraction grating 10 having a square form with a side of 2 mm. The maximum deflection angle may be about 3.5°. If the diffraction grating 10 has a pitch of 600 lines/mm then a 75 nm wavelength shift occurs with a deflection through $1\frac{1}{2}°$.

The device shown in FIG. 2 may be used in an external cavity associated with a laser chip so that radiation emitted from the laser chip, after collimation, impinges on the diffraction grating and radiation centred on a particular wavelength is then back reflected to the laser chip. In other applications, the device could be used as a source for either direct detection or coherent systems in optical communications systems.

Figure 3:
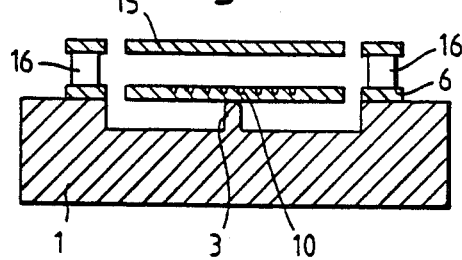
FIG. 3 is a view similar to FIG. 2 but of a second example.

The example shown in FIG. 3 is similar to that shown in FIGS. 1 and 2 except that an additional torsion plate 15 is laminated with spacers 16 to the torsion plate 6. The torsion plate 15 and spacers 16 may be integrally formed with the remainder of the device or alternatively integrally formed together and then bonded to the plate 6. If the torsion plate 15 is made of silicon, this is transparent only at 1.3 and 1.5 microns thus providing a fine tuning element. The remainder of the device functions in exactly the same way as the first example.

I claim:

1. A wavelength selection device comprising a substrate; a deflectable wavelength selection member no more than 2 mm in at least one dimension provided by a torsion member mounted to the substrate; and control means responsive to control signals to cause the selection member to deflect, whereby radiation centered on a predetermined wavelength is selected from radiation having a number of wavelengths impinging on the selection member by setting the selection member at a predetermined angle to the incoming radiation.

2. A device according to claim 1, wherein the wavelength selection member comprises a diffraction grating.

3. A device according to claim 2, wherein the diffraction grating comprises a reflection grating.

4. A device according to any of the preceding claims, 1, 2 or 3 wherein the torsion member comprises a torsion plate.

5. A device according to any of the preceding claims, 1, 2 or 3 wherein the torsion member is integral with the substrate.

6. A device according to any of the preceding claims, 1, 2 or 3 further comprising a selective wavelength transmission member mounted adjacent the wavelength selection member and movable therewith, the selective wavelength transmission member permitting only certain wavelengths of impinging radiation to be transmitted therethrough.

7. A device according to claim 6, wherein the selective wavelength transmission member and the wavelength selection member are connected together by one or more spacers.

8. A device according to claim 6, wherein the selective wavelength transmission member is mounted such that radiation is incident thereon prior to being incident on the wavelength selection member.

9. A device according to any of the preceding claims, 1, 2 or 3 wherein the substrate comprises silicon.

10. A method of selecting radiation centred on a particular wavelength from an original beam of radiation comprising a number of different wavelengths, the method comprising causing the original beam to impinge on a wavelength selection device according to any of the preceding claims; 1, 2 or 3 and causing the wavelength selection member to deflect whereby only radiation having a wavelength centred on the selected wavelength is deflected through a predetermined angle.

11. An optical wavelength selection device for use in an external resonant cavity of a laser chip, said device comprising:
   a unitary silicon substrate having an integrally formed cavity with a centrally located upstanding ridge and electrostatic control electrodes located on either side of the ridge;
   a torsion plate no more than 2 mm in at least one dimension and integrally formed from silicon with a pair of torsion bars connected to said substrate on either side of said cavity in approximate alignment with said ridge, and
   said torsion plate also having an integrally formed diffraction grating disposed on a side thereof facing away from said cavity.

* * * * *